United States Patent
Methe et al.

(10) Patent No.: US 8,305,701 B2
(45) Date of Patent: Nov. 6, 2012

(54) CONNECTING ARRANGEMENT FOR AN OPTICAL DEVICE

(75) Inventors: Heiko Methe, Kassel (DE); Willi Heintel, Aalen (DE); Sascha Licht, Moenchengosserstaedt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 560 days.

(21) Appl. No.: 12/561,800

(22) Filed: Sep. 17, 2009

(65) Prior Publication Data

US 2010/0065252 A1   Mar. 18, 2010

(30) Foreign Application Priority Data

Sep. 17, 2008 (DE) .......................... 10 2008 047 741

(51) Int. Cl.
*G02B 7/02* (2006.01)
(52) U.S. Cl. .......................... 359/822; 359/820; 359/811
(58) Field of Classification Search .................. 359/811, 359/813, 814, 822, 824; 385/56, 58, 134, 385/136, 147; 348/373; 165/96, 185; 267/158; 396/133; 353/100, 101
See application file for complete search history.

(56) References Cited

U.S. PATENT DOCUMENTS

| | | | | |
|---|---|---|---|---|
| 5,204,712 A * | 4/1993 | Bouwer et al. | ................... | 355/53 |
| 5,537,501 A * | 7/1996 | Iwano et al. | ..................... | 385/58 |
| 6,443,628 B1 * | 9/2002 | Horie et al. | ...................... | 385/73 |
| 6,547,402 B2 * | 4/2003 | Masuda | ......................... | 353/101 |
| 6,870,632 B2 * | 3/2005 | Petasch et al. | ................ | 356/614 |
| 7,346,255 B2 * | 3/2008 | Yamaguchi et al. | .......... | 385/136 |
| 7,907,839 B2 * | 3/2011 | Shin et al. | ...................... | 396/133 |
| 2002/0163741 A1 | 11/2002 | Shibazaki | | |

FOREIGN PATENT DOCUMENTS

WO    WO 03/087944    10/2003

* cited by examiner

*Primary Examiner* — Loha Ben
(74) *Attorney, Agent, or Firm* — Fish & Richardson P.C.

(57) ABSTRACT

The disclosure relates to a connecting arrangement for an optical device, such as in microlithography. The connecting arrangement includes a first body, a second body and a connecting device. The first body contacts the second body in a laminar manner in a contact region. The connecting device is connected to the second body and contacts the first body via at least one contact unit. The connecting device is configured to generate a predefinable contact force in the contact region between the first body and the second body. The contact unit includes a plurality of separate contact elements. Each contact element is connected to the second body via a spring unit which can be elastically deformed to generate a contribution to the contact force.

20 Claims, 6 Drawing Sheets

Fig. 11

CONNECTING ARRANGEMENT FOR AN OPTICAL DEVICE

CROSS-REFERENCE TO RELATED APPLICATIONS

This application claims priority under 35 U.S.C. §119(e)(1) to German Patent Application DE 10 2008 047 741.9, filed Sep. 17, 2008. The contents of German Patent Application DE 10 2008 047 741.9 are hereby incorporated by reference in its entirety.

FIELD

The disclosure relates to connecting arrangements for an optical device and also to methods for generating a predefinable contact force or a predefinable contact surface pressure between two bodies of an optical device. The disclosure may be applied in relation to any desired optical devices or optical imaging methods, such as, for example, in the context of the microlithography used in the manufacture of microelectronic circuits.

BACKGROUND

In the field of microlithography, in addition to the use of components designed with high precision, it is typically desirable to set the position and geometry of optical modules of the imaging device (e.g., the modules with optical elements, such as lenses, mirrors or gratings), as well as the masks and substrates, with high precision in accordance with predefined desired values or to stabilize components of this type in a predefined position or geometry to achieve correspondingly high imaging quality. As used herein, the term "optical module" denotes both optical elements alone and modules having optical elements and further components, such as for example mounting parts, etc.

SUMMARY

In some embodiments, the disclosure provides a connecting arrangement for an optical device and also a method for generating a predefinable contact force or a predefinable contact surface pressure between two bodies of an optical device that can exhibit reduced undesirable characteristics and that can also ensure, for example, good heat transmission between the two bodies in a simple manner.

The disclosure is based on the finding that particularly high transmission of heat between the two bodies may be achieved by ensuring, via a connecting device acting on both bodies, that there is achieved at each point of the contact region of the two bodies a local contact surface pressure which differs from the mean contact surface pressure between the two bodies only by a low value. The local contact surface pressure can differ from the mean contact surface pressure by less than 20% (e.g., by less than 10%, by less than 5%). In the case of a surface pressure of this type, which is as uniform as possible over the contact region, a uniformly intimate contact between the heat transmission partners is achieved over the contact region, so that there is no local concentration of the transmission of heat and the accompanying loss of heat transmission power and also the accompanying undesirable distortion in the temperature profile of the body in question.

The equalization of the local contact surface pressure may be achieved in a particularly simple manner via one or more elastically deformed spring units which, as a result of the deformation energy stored in them, make a defined contribution to the desired contact force or contact surface pressure. The contact force or contact surface pressure may be produced in this case in a particularly simple manner by adapting the geometrical parameters (e.g., the configuration or arrangement of stop surfaces), so that certain scattering effects, such as may occur when a defined tightening torque for a screw connection is implemented, may be greatly reduced. In addition, it is possible in a particularly simple manner to achieve the described equalization of the contact surface pressure by way of a plurality of contact elements with spring units of this type.

In certain embodiments, the disclosure provides a connecting arrangement for an optical device, in particular for microlithography, with a first body, a second body and a connecting device. The first body contacts the second body in a laminar manner in a contact region, and the connecting device is connected to the second body and contacting the first body via at least one contact unit. The connecting device is configured to generate, in the contact region, a predefinable contact force between the first body and the second body. The contact unit includes a plurality of separate contact elements. Each contact element is connected to the second body via a spring unit which is elastically deformed so as to generate a contribution to the contact force.

In some embodiments, the disclosure provides a connecting arrangement for an optical device, in particular for microlithography, with a first body, a second body and a connecting device. The first body or the second body is a component of a heat transmission device for achieving high transmission of heat via a contact region between the first body and the second body. The first body contacts the second body over a large area for achieving high transmission of heat in the contact region. The connecting device is configured to generate, in the contact region, a predefinable contact force between the first body and the second body. The connecting device contacts the first body with a contact element via at least one contact unit. The contact element is connected to the second body via a spring unit which is elastically deformed so as to generate a contribution to the contact force.

As referred to herein, a large area contact means the contact surface of the contact area between the first body and the second body is at least 100%, such as at least 200%, of the area of the perpendicular projection of the connecting device onto the contact surface of both bodies.

In certain embodiments, the disclosure provides a connecting arrangement for an optical device, in particular for microlithography, with a first body, a second body and a connecting device. The first body or the second body is a component of a heat transmission device for achieving high transmission of heat via a contact region between the first body and the second body. The first body contacts the second body over a large area for achieving high transmission of heat in the contact region. The connecting device is configured to generate, in the contact region, a predefinable mean contact surface pressure between the first body and the second body. The connecting device is furthermore configured to generate, at each point of the contact region, a local contact surface pressure between the first body and the second body which differs from the mean contact surface pressure by less than 20% (e.g., by less than 10%, by less than 5%).

In some embodiments, the disclosure provides a method for exerting a contact force between a first body and a second body of an optical device, in particular for microlithography, in which the first body is brought into laminar contact with the second body in a contact region and a connecting device is connected to the second body. The connecting device contacts the first body via at least one contact unit. The connecting device, in the contact region, generates a predefinable contact force between the first body and the second body. The contact unit includes a plurality of separate contact elements. Each contact element is connected to the second body via a spring unit which is elastically deformed so as to generate a contribution to the contact force.

In certain embodiments, the disclosure provides a method for exerting a contact force between a first body and a second body of an optical device, in particular for microlithography, in which the first body is brought into large area contact with the second body in a contact region. The first body or the second body is a component of a heat transmission device for achieving high transmission of heat via the contact region. A predefinable contact force is generated between the first body and the second body via a connecting device in the contact region. The connecting device contacts the first body with a contact element via at least one contact unit. The contact element is connected to the second body via a spring unit which is elastically deformed so as to generate a contribution to the contact force.

In some embodiments, the disclosure provides a method for exerting a contact surface pressure between a first body and a second body of an optical device, in particular for microlithography, in which the first body is brought into large area contact with the second body for achieving high transmission of heat in a contact region. The first body or the second body is a component of a heat transmission device for achieving high transmission of heat via the contact region. A predefinable mean contact surface pressure is generated between the first body and the second body via a connecting device in the contact region. The connecting device, at each point of the contact region, generates a local contact surface pressure between the first body and the second body which differs from the mean contact surface pressure by less than 10%, such as by less than 5%.

Embodiments of the disclosure will become further apparent from the claims and detailed description, which refers to the appended drawings.

DETAILED DESCRIPTION

First Embodiment

In the following, an exemplary embodiment of the optical device which is used in an optical imaging device for microlithography will be described with reference to FIGS. 1 to 5. In order to simplify the following description an xyz coordinate system is introduced in which the z direction denotes the vertical direction. However, it will be appreciated that, with other variants of the disclosure, any other desired orientation of the components of the imaging device in space may also be provided.

Figure 1:
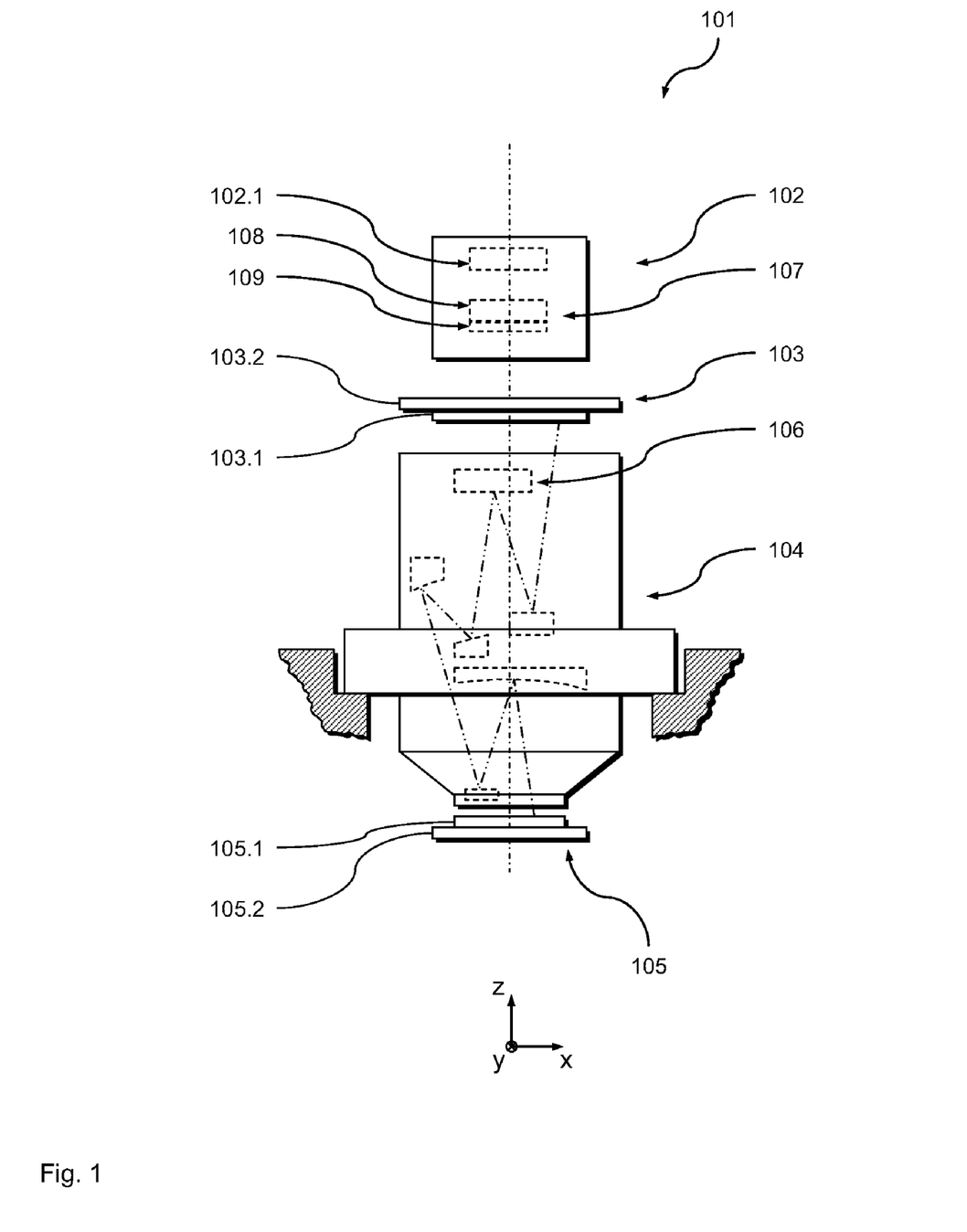
FIG. 1 is a schematic view of an optical imaging device including a connecting arrangement that allows executing a method for exerting a contact force between two bodies of the optical imaging device.

FIG. 1 is a schematic view of an exemplary embodiment of the optical imaging device in the form of a microlithography device 101 which operates with light in the EUV range having a wavelength from 5 nm to 20 nm, in the present example about 13 nm.

The microlithography device 101 includes an illumination system 102, a mask device 103, an optical projection system in the form of an objective 104 and a substrate device 105. The illumination system 102 illuminates (via a light guide device not shown in FIG. 1) a mask 103.1, which is arranged on a mask stage 103.2 of the mask device 103, with a projection light bundle (not shown in greater detail). Located on the mask 103.1 is a projection pattern which is projected with the projection light bundle via the optical elements, arranged in the objective 104, of an optical element group 106 onto a substrate in the form of a wafer 105.1 arranged on a wafer table 105.2 of the substrate device 105.

The illumination system 102, in addition to a light source 102.1, includes an exemplary embodiment of a connecting arrangement 107 including an optically active component in the form of a first body 108 and a second body 109 connected thereto. The first body 108 and the second body 109 contact each other in a contact region 110 via a first contact surface 108.1 of the first body 108 and a second contact surface 109.1 of the second body 109.

The first body 108 is an optical element (i.e. in the present EUV system a mirror). However, it will be understood that, with other variants of the disclosure, the first body may also be any other desired component of the microlithography device. The second body 109 is a component of a heat transmission device which serves to achieve, via the contact region 110, high transmission of heat between the first body 108 and the second body 109.

In the simplest case, the second body 109 may be a passive cooling body which withdraws heat from the first body 108. However, it will be understood that the second body may, in other variants of the disclosure, also be a component of a heat transmission device by which, at least temporarily, heat is supplied to the first body 108. Furthermore, it will be understood that the second body may also be part of an active heat transmission device which supplies heat to and/or removes heat from the first body via a corresponding energy circuit (for example by means of Peltier elements, gas and/or liquid circuits, etc.).

Owing to the working wavelength of 13 nm, all of the optical elements used in the imaging device 101 are reflective optical elements. It will however be understood that, in other variants of the disclosure which operate with light in other wavelength ranges, refractive, reflective and/or diffractive elements may be used alone or in any desired combination.

Figure 2:
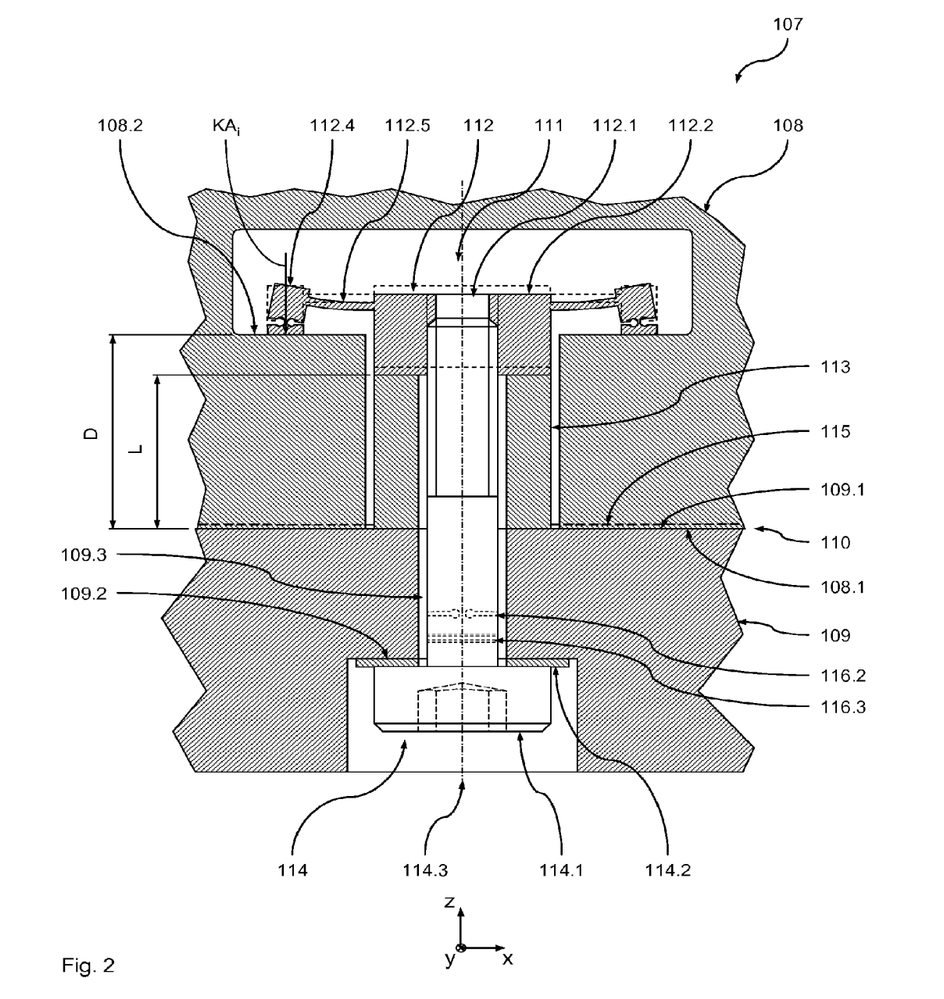
FIG. 2 is a schematic sectional view of a connecting arrangement of the imaging device of FIG. 1.

FIG. 2 is a schematic sectional view of the connecting arrangement 107. As may be seen from FIG. 2, the first body 108 and the second body 109 are connected via a connecting device 111 which, in the contact region 110, generates a predefinable contact force K (in the z direction) between the first body 108 and the second body 109, thus producing, in the contact region 110, a predefinable mean contact surface pressure pm between the first body 108 and the second body 109.

For this purpose, the connecting device includes a first contact unit 112, a spacer element in the form of a spacer sleeve 113 and a second contact unit in the form of a screw unit 114 with screws 114.1 and washers 114.2, the first contact unit 112 contacting the first body 108, while the second contact unit 114 contacts the second body 109 and is connected to the first contact unit 112, so that the first body 108 and the second body 109 are connected thereby.

As may be seen from FIG. 2, the head of the screw 114.1 rests on a shoulder 109.2 of the second body 109 via the washer 114.2, while the shaft of the screw 114.1 is inserted through a through-hole 109.3 in the second body 109 and also the interior of the spacer sleeve 113 (with play). The threaded end of the screw 114.1 is screwed into a tapped hole 112.1 in the first contact unit 112 to an extent that is sufficient for the spacer sleeve 113 to be clamped between mutually facing stop surfaces of the first contact unit 112 and the second body 109.

This configuration has the advantage of eliminating the risk of tilting between the two contact units 112 and 114 relative to each other and to the second body 109, thus providing in an advantageous manner additional stability for the connection between the two bodies 108 and 109.

It should also be noted at this point that, with other variants of the disclosure, instead of the screw 114.1, it is of course also possible to provide any other desired tensioning device by which the spacer sleeve 113 may be clamped between the mutually facing stop surfaces of the first contact unit 112 and the second body 109.

Figure 3:
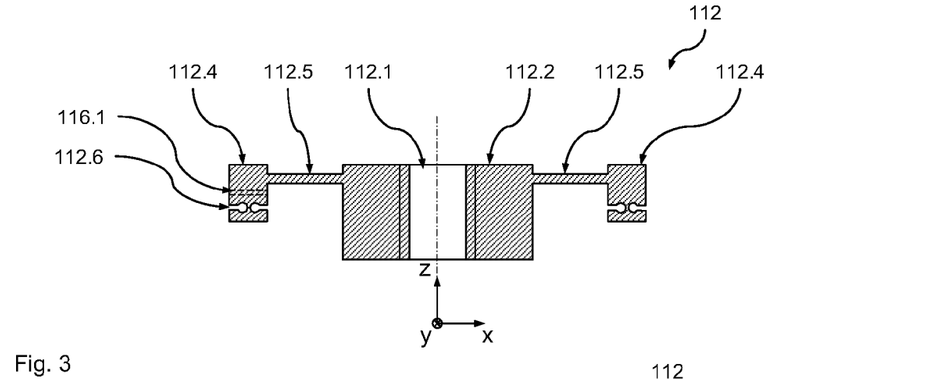
FIG. 3 is a schematic sectional view of the contact unit of the connecting device from FIG. 2 in the non-assembled state (along line III-III of the FIG. 4)

As may be seen from FIG. 2 and FIG. 3 (which shows the first contact unit 112 in the non-assembled state of), the first contact unit 112 includes a carrier element 112.2 in which there is provided the tapped hole 112.1 for the screw 114.1. As may also be seen from FIG. 4, the carrier element is designed as an elongated element having, in a plane (here: the xy plane) perpendicular to the direction of the contact force K (here: the z direction), a longitudinal axis 112.3 (running parallel to the y axis in the present example).

In the present example, on both sides of the longitudinal axis 112.3, there are arranged a plurality of separate contact elements 112.4 resting, in the assembled state (see FIG. 2), on a shoulder 108.2 of the first body 108 formed by a recess provided in the first body 108 and having a T-shaped cross section. Optionally, at least five to ten contact elements are provided on both sides in order to achieve a distribution which is as uniform as possible of the bearing forces $KA_i$ exerted on the first body 108 via the contact elements. In the present example, 14 contact elements 112.4 are arranged in each case on each side of the carrier element 112.2. It will however be appreciated that, with other variants of the disclosure, depending on the dimensions of the contact region, a different number of contact elements may also be provided. In particular, it is on the one hand also possible that, in each case, only one contact element is arranged on each side of the carrier element. Equally, it is possible that the contact elements are arranged only on one side of the carrier element. Likewise, just a single contact element may be provided on the carrier element.

Figure 4:
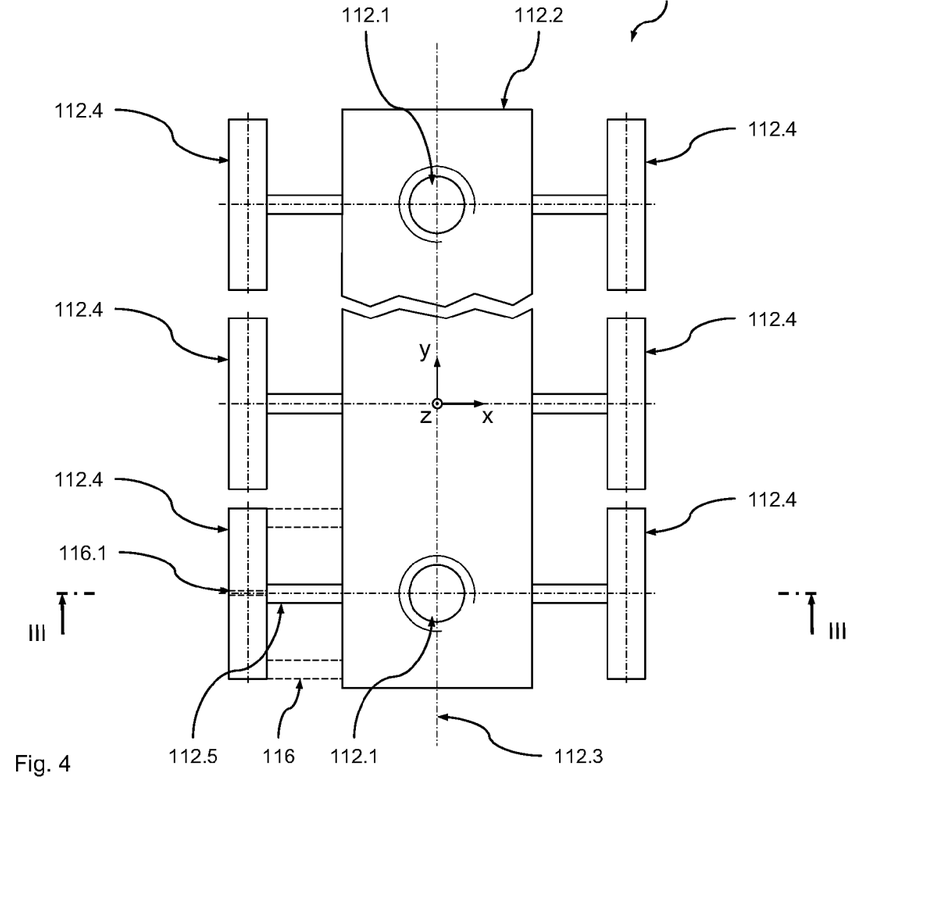
FIG. 4 is a schematic plan view onto the contact unit of FIG. 3.

In the example shown, the contact elements are arranged symmetrically to a plane (yz plane) containing the longitudinal axis 112.3. It will however be understood that, in other variants of the disclosure, provision may also be made for the contact elements of the two sides to be arranged offset from one another in the direction of the longitudinal axis.

Furthermore, additionally or alternatively, a different number of contact elements may be provided on the two sides.

As may also be seen from FIG. 4, a plurality of tapped holes 112.1 are provided along the longitudinal axis 112.3, so that the first contact unit 112 may be connected to the second body 109 via a plurality of spacer sleeves 113 and second contact units 114.

The respective contact element 112.4 is connected to the carrier element 112.2 via a spring unit 112.5. In the present example, the spring unit 112.5 is designed as a simple leaf spring which is connected monolithically to the carrier element 112.2 and the contact element 112.4. It will however be appreciated that, with other variants of the disclosure, any other desired configuration and/or linking of the spring unit to the carrier element and/or the contact element may also be provided. In particular, a releasable connection may be provided in each case.

As may be seen from FIG. 2, the length L of the spacer sleeve 113 in the direction of the longitudinal axis 114.3 of the screw 114.1 is configured to the geometry of the first body 108 and of the second body 109 (here: to the distance D between the first contact surface 108.1 and the shoulder 108.2 along the longitudinal axis of the screw 114.1) in such a way that, when the screw 114.1 is tightened, a defined elastic deformation of the respective spring unit 112.5 is obtained. This deformation of the spring unit 112.5, via the contact element 112.4, causes the exertion of a bearing force $KA_i$ in the direction of the contact force K onto the first body 108, the bearing force making a contribution to the contact force K, wherein in the present example the following applies:

$$K = \sum_i KA_i. \qquad (1)$$

This configuration has the advantage that the respective bearing force $KA_i$ and thus the contact force K, depends merely on the production precision of the components involved and not on an exact tightening torque of the respective screw 114.1. On the contrary, it is sufficient to tighten the screw 114.1 sufficiently securely without the tightening torque of the screw 114.1 having to be maintained in a correspondingly narrow range. Accordingly, the assembly of the arrangement is greatly simplified.

A further advantage of this arrangement consists in the fact that production imprecisions of the components involved in the connection (i.e. of the first body 108, the second body 109, the first contact unit 112 and/or the spacer sleeve 113) have, depending on the flexural rigidity of the spring units 112.5 (about a bending axis running parallel to the longitudinal axis 112.3), comparatively little effect on the actual bearing force $KA_i$ and thus the contact force K. The lower this flexural rigidity of the spring units is, the less is the influence of production imprecisions of this type and, thus, the scattering of the bearing forces $KA_i$ of the individual contact elements 112.4.

As may be seen from FIG. 4, the contact elements 112.4 are each designed as elements which are elongated (in the direction of the longitudinal axis 112.3) and on which the spring units 112.5 act (optionally) centrally, the spring units 112.5 having a much smaller (width) dimension in this direction. Optionally, the dimension of the contact elements 112.4 in this direction (y direction) is at least 5 to 20 times the (width) dimension of the respective spring unit 112.5.

This configuration has the advantage that production imprecisions of the first body 108, the second body 109 and/or the first contact unit 112 in this direction may be compensated by a deformation (in this case a torsion) of the spring unit 112.5 about its longitudinal axis, thus eliminating the risk of excessive local concentration of the bearing force $KA_i$ induced by production imprecisions of this type; instead, as well in the region of the respective contact element 112.4, a distribution of the contact force which is as uniform as possible or a surface pressure pk at the contact surface between the contact element 112.4 and the first body 108 which is as uniform as possible is present.

In order to avoid local force peaks, the respective contact element 112.4 also has a compensation device in the form of a flexural joint 112.6 which compensates the tilting of the contact element 112.4 as a consequence of the deformation of the spring unit 112.5 about the bending axis of the spring unit 112.5.

As a result of this and as a result of the large number of contact elements 112.4, there is achieved in an advantageous manner a uniform introduction of the forces into the first body 108 leading to a uniform local contact surface pressure p at each point of the contact region 110.

In the present example, the spring units 112.5 and the spacer sleeves 113 are designed in such a way as to produce, at the respective contact element 112.4, a local surface pressure pk which differs by less than 10%, eventually even by less than 5%, from the mean surface pressure pkm which is obtained from the bearing force $KA_i$ and the bearing surface of all the contact elements 112.4. Together with the distributed arrangement of the contact elements 112.4, this produces, at each point of the contact region 112 between the first body 108 and the second body 109, a local contact surface pressure p which differs from the mean contact surface pressure pm by less than 10%, eventually even by less than 5%. This therefore results in an advantageously uniform contact surface pressure between the first body 108 and the second body 109 and, thus, (at a correspondingly high mean contact surface pressure pm) a uniformly intimate contact between these two bodies that ensures high transmission of heat between the two bodies 108 and 109.

In order to increase the transmission of heat, a contact means may be provided between the two bodies 108 and 109 in order to improve the transmission of heat, such as is indicated in FIG. 2 by the dashed contour 115. This contact means 115 may be an elastically and/or plastically deformable medium which further increases (e.g., at high thermal conductivity) the intimacy of the contact between the two bodies 108 and 109, i.e. therefore reduces the heat resistance. This contact means 115 may be both a solid and a liquid and/or paste-like medium (for example a heat conducting paste) or any desired combination thereof.

In the present example, a leaf spring 112.5 acts in each case on the respective contact element 112.4. It will however be understood that, in other variants of the disclosure, provision may also be made for a plurality of leaf springs of this type to act in the longitudinal direction of the contact element 112.4. In particular, provision may be made for a leaf spring to act in each case at both ends of the contact element, such as is indicated in FIG. 4 by the broken contour 116.

In order to avoid local force peaks, the respective contact element 112.4 may in this case (but also with the designs having only one leaf spring 112.5) have a further compensation device in the form of a flexural joint 112.6 as it is indicated in FIGS. 3 and 4 by the dashed contour 116.1. This flexural joint 116.1 is designed similar to the flexural joint 112.6 but has a bending axis rotated by 90° and arranged (in the unloaded state) essentially parallel to the longitudinal axis of the leaf spring 116 (and 112.5, respectively).

By this means, tilting of the contact element 112.4 due to production imprecisions of the first body 108, the second body 109 and/or the first contact unit 112 in this direction may be compensated by a deformation of the flexural joint 116.1 about its bending axis (instead of the torsion of the spring unit 116 and 112.5, respectively), thus eliminating the risk of excessive local concentration of the bearing force $KA_i$ induced by production imprecisions of this type; instead, as well in the region of the respective contact element 112.4, a distribution of the contact force which is as uniform as possible or a surface pressure pk at the contact surface between the contact element 112.4 and the first body 108 which is as uniform as possible is present.

In order to avoid local force peaks in the area of the contact surface of the screw 114.1, the shaft of the screw 114.1 may be provided with a further compensation device in the form of one or more flexural joints. For example, (by corresponding cuts) two flexural joints having bending axes mutually rotated by 90° and arranged transverse to the longitudinal axis of the screw 114.1 may be provided as it is indicated in FIG. 2 by the dashed contours 116.2 and 116.3. Likewise, one single flexural joint may be realized by a circumferential cut in the shaft of the screw 114.1.

Figure 5:
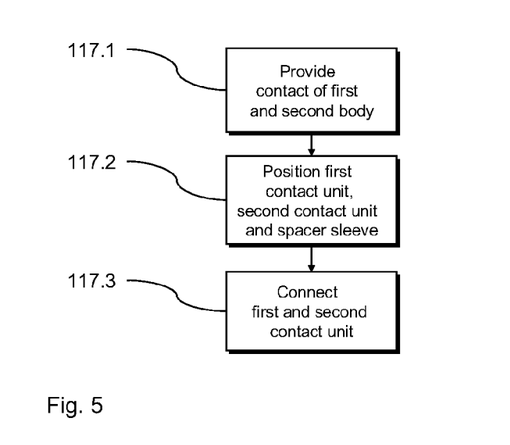
FIG. 5 is a block diagram of a method for exerting a contact force between two, which method may be carried out using the optical imaging device from FIG. 1.

FIG. 5 is a flow chart of a method for generating a contact force between the two bodies 108 and 109, which method is carried out using the microlithography device 101.

First, in a step 117.1, the first body 108 and the second body 109 are brought into contact with each other in the contact region 110.

In a step 117.2, the first contact unit 112, the spacer sleeves 113 and the second contact units 114 are then brought into the above-described spatial relationship to one another.

Subsequently, in a step 117.3, the screws 114.1 are screwed into the tapped holes 112.1, thus producing between the first body 108 and the second body 109 the above-described connection producing the predefinable contact force K with the uniform local contact surface pressure p.

Second Embodiment

An exemplary embodiment of the connecting arrangement 207 will be described hereinafter with reference to FIGS. 1, 2 and 6. The connecting arrangement 207 may be used in the imaging device 101 instead of the connecting arrangement 107. The connecting arrangement 207, in its basic design and mode of operation, corresponds to the connecting arrangement 107 of FIG. 2, so that merely the differences will be dealt with here. In particular, similar components are provided with reference numerals increased by the value 100. Unless otherwise stated hereinafter, reference is expressly made to the foregoing discussion with regard to the features of these components.

Figure 6:
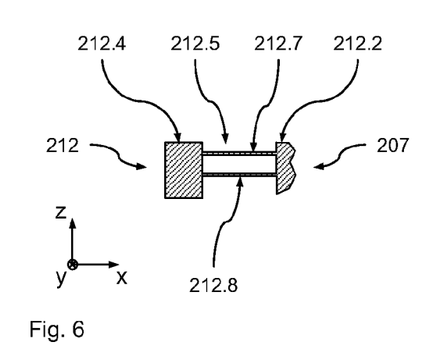
FIG. 6 is a schematic sectional view of a part of the contact unit of a connecting arrangement.

FIG. 6 is a section through a part of the first contact unit 212. The only difference between the contact unit 212 and the contact unit 112 consists in the configuration of the spring unit 212.5, which in the present example has two leaf springs 212.7 and 212.8 which are positioned one above the other, extend parallel to each other (in the undeformed state) and by which the contact element 212.4 is connected to the carrier element 212.2.

These leaf springs 212.7 and 212.8, as well as generating the bearing force $KA_i$, provide parallel guidance of the contact element 212.4, thus preventing the contact element 212.4 from tilting about the bending axis of the leaf springs 212.7 and 212.8. In other words, this additionally provides a compensation device which prevents the occurrence of local force peaks in the region of the bearing surface of the contact element 212.4 onto the first body 108.

Third Embodiment

An exemplary embodiment of the connecting arrangement 307 will be described hereinafter with reference to FIGS. 1, 2 and 7. The connecting arrangement 307 may be used instead of the connecting arrangement 107 in the imaging device 101. The connecting arrangement 307, in its basic design and mode of operation, corresponds to the connecting arrangement 107 from FIG. 2, so that merely the differences will be dealt with here. In particular, similar components are provided with reference numerals increased by the value 200. Unless otherwise stated hereinafter, reference is expressly made to the foregoing discussion with regard to the features of these components.

Figure 7:
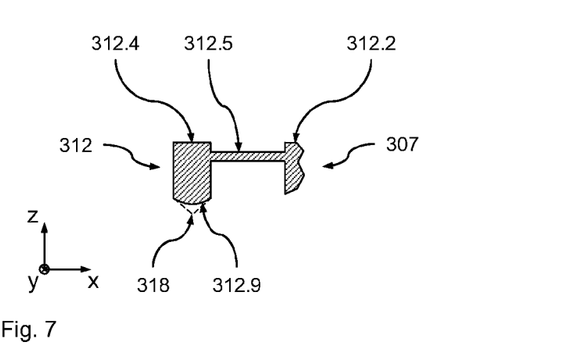
FIG. 7 is a schematic sectional view of a part of the contact unit of a connecting arrangement.

FIG. 7 is a section through a part of the first contact unit 312. The only difference between the contact unit 312 and the contact unit 112 consists in the configuration of the contact element 312.4. The contact element 312.4 has in this example a convex bearing surface 312.9 providing a compensation device which prevents the occurrence of local force peaks in the region of the bearing surface of the contact element 312.4 onto the first body 108.

As an alternative to the convex configuration of the bearing surface 312.9, a configuration with a blade-shaped rest may also be provided, such as is indicated in FIG. 7 by the dashed contour 318.

Fourth Embodiment

An exemplary embodiment of the connecting arrangement 407 will be described hereinafter with reference to FIGS. 1, 2, 8 and 9. The connecting arrangement 407 may be used instead of the connecting arrangement 107 in the imaging device 101. The connecting arrangement 407 corresponds, in its basic design and mode of operation, to the connecting arrangement 107 from FIG. 2, so that merely the differences will be dealt with here. In particular, similar components are provided with reference numerals increased by the value 300. Unless otherwise stated hereinafter, reference is expressly made to the foregoing discussion with regard to the features of these components.

Figure 8:
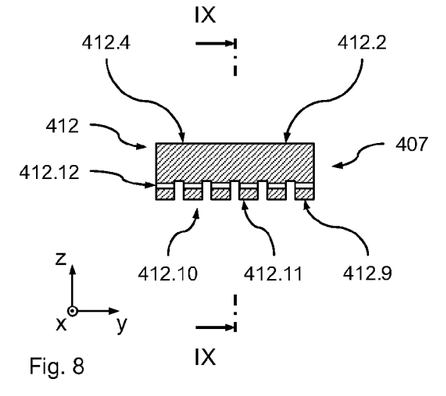
FIG. 8 is a schematic sectional view of a part of the contact unit of connecting arrangement (along the line VIII-VIII of FIG. 9)
Figure 9:
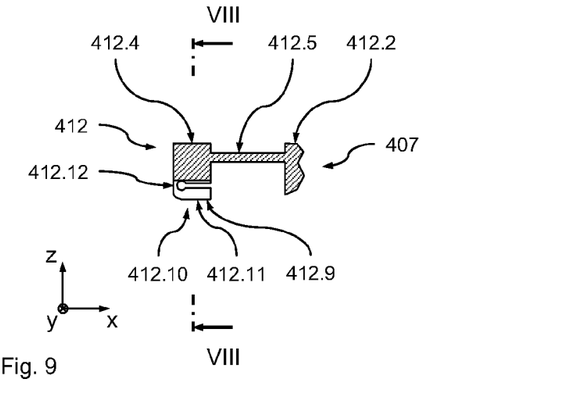
FIG. 9 is a further schematic sectional view of the contact unit of FIG. 8 along the line IX-IX.

FIGS. 8 and 9 are different sections through a part of the first contact unit 412. The only difference between the contact unit 412 and the contact unit 112 consists in the configuration of the contact element 412.4. The contact element 412.4 has in this example a bearing region 412.10 which is configured in a comb-like manner and has a plurality of bearing elements 412.11 forming the bearing surface 412.9 for the first body 108.

The bearing elements 412.11 are each articulated to the contact element 412.4 via a flexural joint 412.12, so that they produce on the one hand a compensation device which compensates for the tilting of the contact element 412.4 as a consequence of the deformation of the spring unit 412.5 about the bending axis of the spring unit 412.5 and, thus, prevent the occurrence of local force peaks in the region of the bearing surface of the contact element 412.4 on the first body 108.

A further advantage of the separate bearing elements 412.11 resides in the improved compensation for local production imprecisions of the contact surfaces between the contact element 412.4 and the first body 108, so that a still further equalized surface pressure is achieved. In this case too, the degree of the equalization depends, again, on the flexural strength of the flexural joints 412.2.

Fifth Embodiment

An exemplary embodiment of the connecting arrangement 507 will be described hereinafter with reference to FIGS. 1, 2 and 10. The connecting arrangement 507 may be used instead of the connecting arrangement 107 in the imaging device 101. The connecting arrangement 507 corresponds, in its basic design and mode of operation, to the connecting arrangement 107 from FIG. 2, so that merely the differences will be dealt with here. In particular, identical components are provided with identical reference numerals and similar components are provided with reference numerals increased by the value 400. Unless otherwise stated hereinafter, reference is expressly made to the foregoing discussion with regard to the features of these components.

Figure 10:
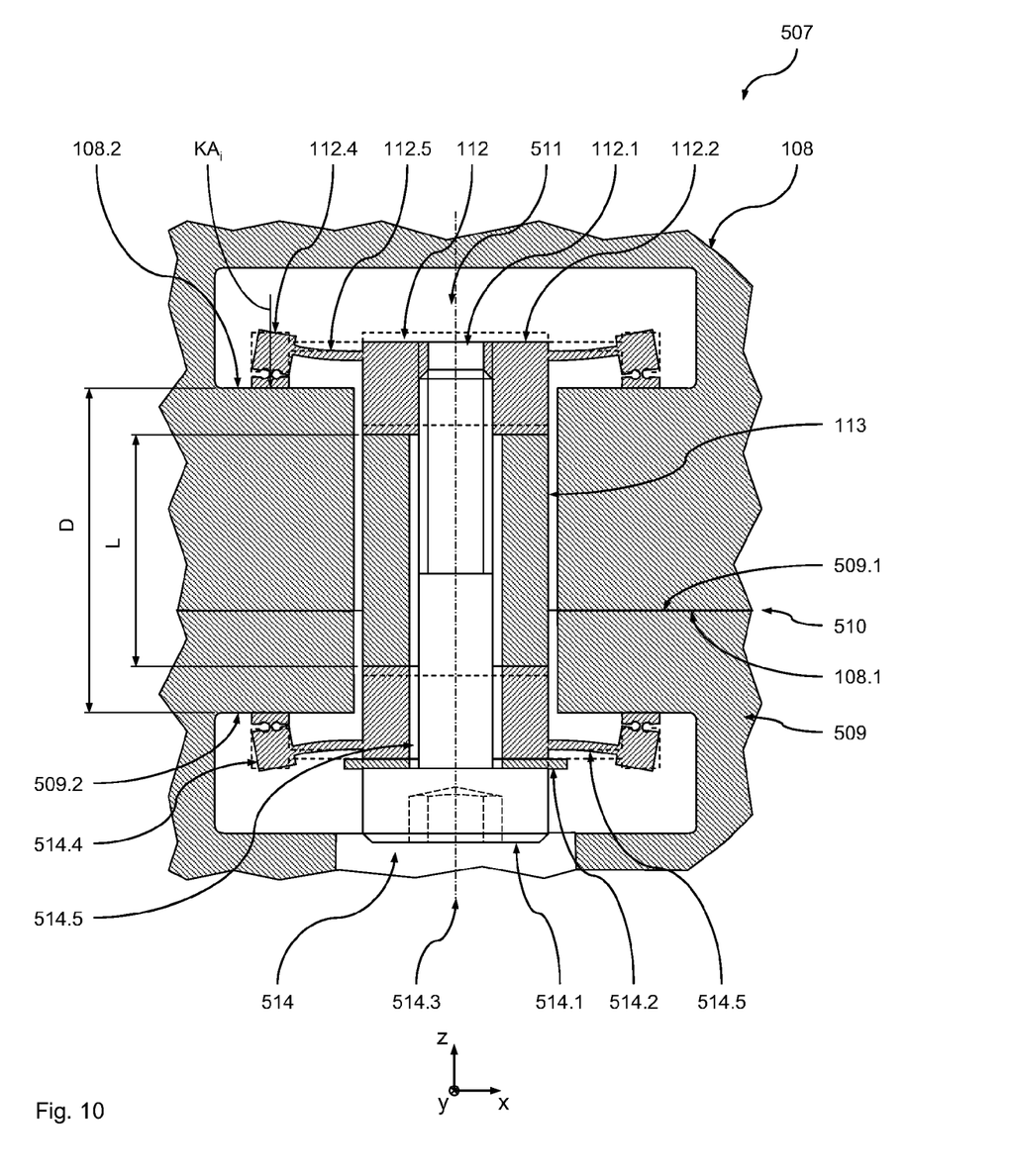
FIG. 10 is a schematic sectional view of a connecting arrangement which may be used in the imaging device of FIG. 1.

FIG. 10 is a schematic sectional view of the connecting arrangement 507 corresponding to the view from FIG. 2. As may be seen from FIG. 10, the first body 108 and the second body 509 are connected via a connecting device 511 which generates a predefinable contact force K (in the z direction) in the contact region 510 between the first body 108 and the second body 509, thus providing in the contact region 110 a predefinable mean contact surface pressure pm between the first body 108 and the second body 509.

The difference to the connecting arrangement 107 of FIG. 2 resides merely in the fact that the connecting device 511, in addition to the first contact unit 112 and the spacer sleeve 113, has a second contact unit 514 having, in addition to the screw 114.1 and the washer 114.2, a clamping unit 514.4 which, apart from the through-hole (designed with corresponding play) for the screw 114.1, is constructed in an identical manner to the first contact unit 112 and contacts the second body 509. The clamping unit 514.4, in the manner described above in relation to the first embodiment, is connected to the first contact unit 112 via the screw 114.1 and the spacer sleeve 113, so that the first body 108 and the second body 509 are connected thereby.

As may be seen from FIG. 10, the head of the screw 114.1 rests on a shoulder of the clamping unit 514.4 via the washer 114.2, while the shank of the screw 114.1 is guided through a through-hole in the clamping unit 514.4 and also the interior of the spacer sleeve 113 (with play). The threaded end of the screw 114.1, again, is screwed into the tapped hole 112.1 in the first contact unit 112 to an extent sufficient for the spacer sleeve 113 to be clamped between mutually facing stop surfaces of the first contact unit 112 and the clamping unit 514.4.

As may be seen from FIG. 10, the length L of the spacer sleeve 113 in the direction of the longitudinal axis 114.3 of the screw 114.1 is configured to the geometry of the first body 108 and of the second body 109 (here: to the distance D between the shoulder 108.2 and the shoulder 509.2 along the longitudinal axis of the screw 114.1) in such a way that, when the screw 114.1 is tightened, a defined elastic deformation of the respective spring unit 112.5 or 514.5 is obtained (from which the desired contact force K between the first body 108 and the second body 509 results).

Sixth Embodiment

An exemplary embodiment of the connecting arrangement 607 will be described hereinafter with reference to FIGS. 1, 2 and 11. The connecting arrangement 607 may be used instead of the connecting arrangement 107 in the imaging device 101. The connecting arrangement 607 corresponds, in its basic design and mode of operation, to the connecting arrangement 107 of FIG. 2, so that merely the differences will be dealt with here. In particular, identical components are provided with identical reference numerals and similar components are provided with reference numerals increased by the value 500. Unless otherwise stated hereinafter, reference is expressly made to the foregoing discussion with regard to the features of these components.

Figure 11:
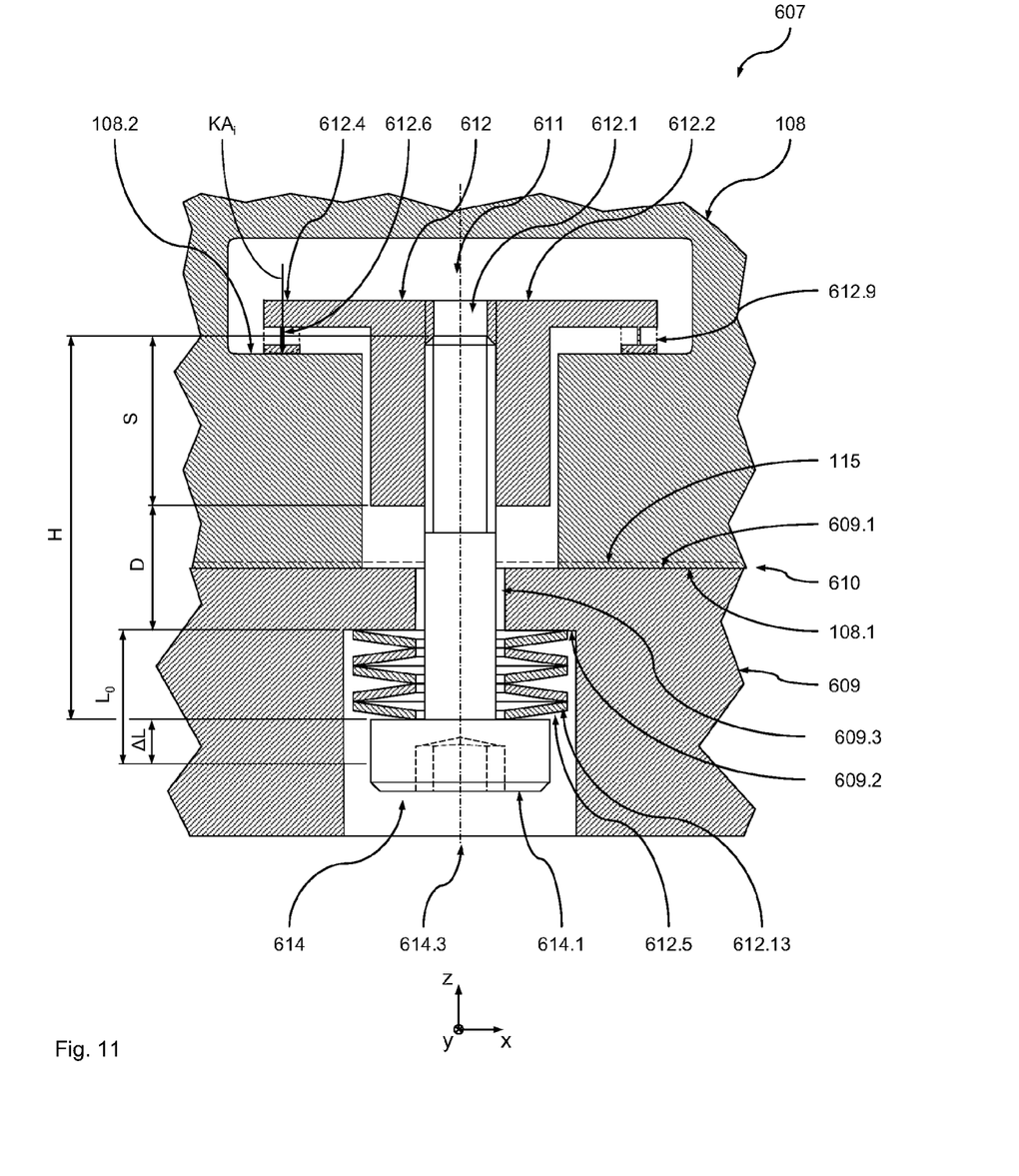
FIG. 11 is a schematic sectional view of a connecting arrangement which may be used in the imaging device of FIG. 1.

FIG. 11 is a schematic sectional view of the connecting arrangement 607 corresponding to the view of FIG. 2. As may be seen from FIG. 11, the first body 108 and the second body 109 are connected via a connecting device 611 which generates a predefinable contact force K (in the z direction) in the contact region 610 between the first body 108 and the second body 609, thus producing a predefinable mean contact surface pressure pm between the first body 108 and the second body 609 in the contact region 110.

The difference to the connecting arrangement 107 of FIG. 2 consists in the fact that the connecting device 611 includes, in addition to a first contact unit 612 contacting the first body 108, a second contact unit 614 having, in addition to the screw 614.1, merely a spring unit 612.5 which contacts the second body 609.

The spring unit 612.5 is configured as a plate spring pack which has a series of plate springs 612.13 and is supported on the one hand on the shoulder 609.2 of the second body 609 and on the other hand on the head of the screw 614.1. The shaft of the screw 614.1 is inserted through the through-holes in the plate springs 612.13 (with play). The threaded end of the screw 614.1 is, again, screwed into a tapped hole 612.1 in the first contact unit 612 to an extent sufficient for the plate spring pack 612.5 to be compressed, so that the first body 108 and the second body 609 are connected via the connecting device 611 while applying the predefinable contact force K.

As may be seen from FIG. 11, the first contact unit 612 is constructed, in contrast to the contact unit 112, in such a way that the contact elements 612.4 are designed to be substantially rigid in the direction of the respective bearing force $KA_i$, so that the respective bearing force $KA_i$, and thus the contact force K, is determined substantially by the compression $\Delta L$ of the plate spring pack 612.5 relative to a stress-relieved length $L_0$ (present in the load-free state) of the plate spring pack 612.5.

In order to avoid local force peaks, the contact elements 612.4 include in the present example, again, a compensation device in the form of a leaf spring-like flexural joint 612.6 which can compensate for any tilting of the contact element 612.4 with respect to the bearing surface 108.2 on the first body 108. It will however be understood that the above-described variants of a compensation device of this type may also be used instead of the flexural joint 612.6, such as is indicated in exemplary fashion by the dashed contour 612.9.

The shank length H (measured in the direction of the longitudinal axis 614.3) of the screw 614.1 is configured to the geometry of the first contact unit 612 and the second body 609 (here: to the distance D, measured along the longitudinal axis of the screw 614.1, between the start of the thread of the tapped hole 612.1 and the shoulder 609.2) in such a way that at a predefined depth S of insertion of the screw 614.1 into the tapped hole 612.1 (i.e. at a predefinable number of turns of the screw 604.1 in the tapped hole 612.1), the desired compression $\Delta L$ of the plate spring pack 612.5, and accordingly a defined elastic deformation of the spring unit 612.5, is obtained, from which the desired contact force K between the first body 108 and the second body 609 results.

In certain variants of the disclosure, high compression $\Delta L$ of particularly soft plate springs 612.13 is provided. This has the advantage that deviations from the predefined compression $\Delta L$ have only a comparatively minor effect on the contact force K. Generally, a large number of plate springs 612.13 are used for this purpose.

It will be appreciated that, with other variants of the disclosure, use may also be made of any other desired types of springs or resilient elements which generate the desired contact force K by way of a resilient change in length. It is in this case not compulsory to provide a compression (or compressive stress) of the respective resilient element. On the contrary, on appropriate configuration of the connections to the screw or the second body, straining (or tensile stress) of the resilient element in question may also be provided.

The disclosure has been described hereinbefore based on examples in which the first body is an optically active component, while the second body is part of a heat transmission device. It will however be appreciated that, with other variants of the disclosure, an inverted allocation of roles may also be provided, i.e. the second body may be an optically active component, while the first body is such a component of a heat transmission device.

Furthermore, the disclosure has been described hereinbefore based on examples in which exclusively optically active elements of an illumination device were connected to a second body of a heat transmission device. It should however be noted at this point that the disclosure may of course also be applied in relation to the transmission of heat in other optically active components of the imaging device, in particular of components of the mask device and/or the substrate device and/or the objective.

Finally, it should be noted that the disclosure has been described hereinbefore based on examples from the field of microlithography. It will however be appreciated that the disclosure may equally also be employed for any other desired applications or imaging methods, in particular at any desired wavelengths of the light used for imaging.

What is claimed is:

1. A connecting arrangement, comprising:
   a first body;
   a second body contacting the first body in a laminar manner in a contact region;
   a contact unit comprising a plurality of separate contact elements;
   a spring unit; and
   a connecting device connected to the second body, the connecting device contacting the first body via the contact unit, and the connecting device configured to generate a predefinable contact force in the contact region between the first body and the second body,
   wherein each of the separate contact elements is connected to the second body via the spring unit, the spring unit is configured to elastically deform to generate a contribution to the predefinable contact force, and the connecting arrangement is configured to be used in an optical device.

2. The connecting arrangement according to claim 1, wherein the spring unit comprises at least leaf spring and/or at least one plate spring.

3. The connecting arrangement according to claim 1, wherein:
   the contact unit comprises a carrier element;
   the spring unit is connected to the contact element; and
   at least one of the following holds:

the carrier element is connected to the second body via a spacer element; and the carrier element is connected to the contact element.

4. The connecting arrangement according to claim 3, wherein the carrier element has a longitudinal axis in a plane perpendicular to a direction of the predefinable contact force, and at least one of the following holds:

two contact elements are arranged on both sides of the carrier element with respect to the longitudinal axis;

two contact elements are arranged spaced apart from each other on the same side of the carrier element with respect to the longitudinal axis; and the carrier element is elongated along the longitudinal axis and at least five contact elements are spaced apart from one another on the same side of the carrier element with respect to the longitudinal axis.

5. The connecting arrangement according to claim 1, wherein the contact element is elongated along its bearing surface on the first body, and during use of the connecting arrangement the contact element is acted upon by the spring unit in a central region of the conact element.

6. The connecting arrangement according to claim 1, wherein:

each contact element comprises a compensation device configured to compensate for tilting of the contact element with respect to the first body;

the compensation device comprises a joint device; and the compensation device has a curved bearing surface facing the first body or a blade-shaped bearing surface facing the first body.

7. The connecting arrangement according to claim 1, wherein at least one of the following holds:

the first body comprises a component selected from the group consisting of an optical device and an optically used component; and the second body comprises a component selected from the group consisting of a cooling body and a component of a heat transmission device configured to transmit heat between the first body and the second body via the contact region.

8. The connecting arrangement according to claim 1, further comprising a contact member in the contact region between the first body and the second body, the contact member configured to improve heat transmission between the first body and the second body.

9. The connecting arrangement according to claim 1, wherein:

each contact element has a bearing surface facing the first body and on which a surface pressure acts to generate the predefinable contact force;

the surface pressures on the contact elements jointly defining a mean surface pressure; and the connecting device is configured so that the surface pressure on each contact element differs from the mean surface pressure by less than 10%.

10. The connecting arrangement according to claim 1, wherein the contact unit is a first contact unit, the connecting device comprises a second contact unit, the second contact unit is connected to the first contact unit, and the connecting device contacts the second body via the second contact unit.

11. The connecting arrangement according to claim 10, wherein the contact elements of the first contact unit are first contact elements, the spring unit is a first spring unit, and the second contact unit comprises a contact element connected to the first contact unit via a second spring unit.

12. A connecting arrangement, comprising:

a first body;

a second body, the first body contacting the second body over a large area to achieve high transmission in a contact region between the first body and the second body, and the first body and/or the second body being a component of a heat transmission device configured to achieve high transmission of heat via the contact region between the first body and the second body;

a connecting device configured to generate a predefinable contact force in the contact region between the first body and the second body;

a contact element;

a compensation device configured to compensate for tilting of the contact element with respect to the first body; and a spring unit, wherein the connecting device contacts the first body via the contact element, the contact element is connected to the second body via the spring unit, the spring unit is configured to be elastically deformed to generate a contribution to the predefinable contact force, and the connecting arrangement is configured to be used in an optical device.

13. The connecting arrangement according to claim 12, wherein:

the compensation device comprises a joint device; and the compensation device has a curved bearing surface facing the first body or a blade-shaped bearing surface facing the first body.

14. A connecting arrangement, comprising:

a first body;

a second body, the first body contacting the second body over a large area to achieve high transmission of heat in a contact region between the first body and the second body, and the first body and/or the second body being a component of a heat transmission device configured to achieve high transmission of heat via the contact region between the first body and the second body;

a connecting device, wherein:

the connecting device is configured to generate a predefinable mean contact surface pressure in the contact region between the first body and the second body;

the connecting device being configured to generate, at each point of the contact region between the first body and the second body, a local contact surface pressure which differs from the mean contact surface pressure by less than 10%; and the connecting arrangement is configured to be used in an optical device.

15. A method, comprising:

providing an optical device comprising a first body and a second body;

bringing the first body into laminar contact with the second body in a contact region;

connecting a connecting device to the second body, the connecting device contacting the first body via a contact unit, the contact unit comprising a plurality of separate contact elements, each of the plurality of contact elements being connected to the second body via a spring unit; and generating, via the connecting device, a predefinable contact force in the contact region between the first body and the second body, wherein generating the predefinable contact force comprises elastically deforming the spring unit.

16. A method, comprising:

providing an optical device comprising a first body and a second body;

bringing the first body into large area contact with the second body in a contact region, the first body and/or the second body being a component of a heat transmission device for achieving high transmission of heat via the contact region; and generating, via a connecting device, a predefinable contact force in the contact region between the first body and the second body, the connecting device contacting the first body via a contact element, the contact element being connected to the second body via a spring unit, wherein generating the predefinable contact force further comprises elastically deforming the spring unit to generate a contribution to the predefinable contact force.

17. The method of claim 16, wherein generating the predefinable contact force further comprises using a compensation device of the contact element to compensate tilting of the contact element with respect to the first body.

18. A method, comprising:

providing an optical device comprising a first body and a second body;

bringing the first body into large area contact with the second body to achieve high transmission of heat in a contact region between the first body and second body, the first body and/or the second body being a component of a heat transmission device for achieving high transmission of heat via the contact region; and generating, via a connecting device, a predefinable mean contact surface pressure in the contact region between the first body and the second body, wherein the connecting device, at each point of the contact region between the first body and the second body, generates a local contact surface pressure which differs from the mean contact surface pressure by less than 10%.

19. A connecting arrangement, comprising:

a first body;

a second body;

a connecting device;

a contact element comprising a compensation device; and a spring unit;

wherein:

the first body and/or the second body is a component of a heat transmission device configured to achieve high transmission of heat via a contact region between the first body and the second body;

the first body contacts the second body over a large area to achieve high transmission of heat in the contact region;

the connecting device is configured to generate a predefinable mean contact surface pressure in the contact region between the first body and the second body;

the connecting device is configured to generate, at each point of the contact region between the first body and the second body, a local contact surface pressure which differs from the mean contact surface pressure by less than 10%;

the connecting device contacts the first body with the contact element;

the contact element is connected to the second body via the spring unit;

the spring unit is configured to be elastically deformed to generate a contribution to the predefinable mean contact surface pressure;

the compensation device is configured to compensate for tilting of the contact element with respect to the first body; and the connecting arrangement is configured to be used in an optical device.

20. The connecting arrangement of claim 19, wherein:

the compensation device comprises a joint device; and the compensation device has a curved bearing surface facing the first body or a blade-shaped bearing surface facing the first body.

* * * * *

UNITED STATES PATENT AND TRADEMARK OFFICE
CERTIFICATE OF CORRECTION

PATENT NO. : 8,305,701 B2  Page 1 of 1
APPLICATION NO. : 12/561800
DATED : November 6, 2012
INVENTOR(S) : Heiko Methe et al.

It is certified that error appears in the above-identified patent and that said Letters Patent is hereby corrected as shown below:

Column 6, line 44, delete "$KA_i$" insert -- $KA_i$, --.

Column 13, line 21, Claim 5, delete "conact" insert -- contact --.

Signed and Sealed this
Nineteenth Day of February, 2013

Teresa Stanek Rea
*Acting Director of the United States Patent and Trademark Office*